US008547749B2

(12) United States Patent
Yip

(10) Patent No.: US 8,547,749 B2
(45) Date of Patent: Oct. 1, 2013

(54) MULTI-PASS PROGRAMMING IN A MEMORY DEVICE

(71) Applicant: Micron Technology, Inc., Boise, ID (US)

(72) Inventor: Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/775,523

(22) Filed: Feb. 25, 2013

(65) Prior Publication Data

US 2013/0163341 A1 Jun. 27, 2013

Related U.S. Application Data

(63) Continuation of application No. 13/286,390, filed on Nov. 1, 2011, now Pat. No. 8,385,118, which is a continuation of application No. 12/276,085, filed on Nov. 21, 2008, now Pat. No. 8,064,252.

(51) Int. Cl.
 *G11C 11/34* (2006.01)
(52) U.S. Cl.
 USPC .............. 365/185.19; 365/185.2; 365/185.29; 365/185.18
(58) Field of Classification Search
 USPC ................. 365/185.19, 185.2, 185.29, 185.18
 See application file for complete search history.

(56) References Cited

U.S. PATENT DOCUMENTS

| 6,643,188 | B2 | 11/2003 | Tanaka et al. |
| 6,888,758 | B1 | 5/2005 | Hemink et al. |
| 7,324,383 | B2 | 1/2008 | Incarnati et al. |
| 7,839,687 | B2 | 11/2010 | Dutta et al. |
| 2002/0191444 | A1* | 12/2002 | Gregori et al. ........... 365/185.19 |
| 2004/0066685 | A1 | 4/2004 | Choi |
| 2007/0121386 | A1 | 5/2007 | Ho et al. |
| 2010/0103734 | A1 | 4/2010 | Hemink |
| 2011/0013460 | A1 | 1/2011 | Dong et al. |
| 2012/0069672 | A1* | 3/2012 | Shiino et al. ............. 365/185.19 |

OTHER PUBLICATIONS

Roohparvar, Frankie F. et al., "Coarse and Fine Programming in a Solid State Memory", (38 pgs. including drawings) U.S. Appl. No. 11/818,683, filed Jun. 15, 2007.

* cited by examiner

*Primary Examiner* — Vu Le
*Assistant Examiner* — Han Yang
(74) *Attorney, Agent, or Firm* — Leffert Jay & Polglaze, P.A.

(57) ABSTRACT

A method for programming a memory device, a memory device, and a memory system are provided. According to at least one such method, a first programming pass generates a plurality of first programming pulses to increase the threshold voltages of target memory cells to either a pre-program level or to the highest programmed threshold. A second programming pass applies a plurality of second programming pulses to the target memory cells to increase their threshold voltages only if they were programmed to the pre-program level. The target memory cells programmed to their respective target threshold levels during the first pass are not programmed further.

21 Claims, 6 Drawing Sheets

MULTI-PASS PROGRAMMING IN A MEMORY DEVICE

RELATED APPLICATIONS

This is a continuation of U.S. Ser. No. 13/286,390, titled "MULTI-PASS PROGRAMMING IN A MEMORY DEVICE" filed Nov. 1, 2011 (allowed), which is a continuation of U.S. Ser. No. 12/276,085, titled "MULTI-PASS PROGRAMMING IN A MEMORY DEVICE" filed Nov. 21, 2008 (now U.S. Pat. No. 8,064,252), each commonly owned and incorporated herein by reference.

TECHNICAL FIELD

The present invention relates generally to memory devices and in a particular embodiment the present invention relates to nonvolatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding a charge. The cells are usually grouped into blocks. Each of the cells within a block can be electrically programmed on a random basis by charging the floating gate. The data in a cell is determined by the presence or absence of the charge in the floating gate. The charge can be removed from the floating gate by a block erase operation.

Each memory cell can be programmed as a single bit per cell (i.e., single level cell—SLC) or multiple bits per cell (i.e., multilevel cell—MLC). Each cell's threshold voltage ($V_t$) determines the data that is stored in the cell. For example, in a single bit per cell, a $V_t$ of 0.5V can indicate a programmed cell while a $V_t$ of −0.5V might indicate an erased cell. The multilevel cell may have multiple $V_t$ ranges that each indicates a different state. Multilevel cells take advantage of the analog nature of a traditional flash cell by assigning a bit pattern to a specific voltage distribution for the cell. This technology permits the storage of two or more bits per cell, depending on the quantity of voltage ranges assigned to the cell.

FIG. 1 illustrates a typical prior art $V_t$ distribution where the vertical axis is the quantity of cells and the horizontal axis is the threshold voltage $V_t$. L0 101 is typically referred to as the erased state and has a negative voltage. The remaining positive states are labeled L1 102, L2 103, and L3 104 and are programmed from the erased state 101.

As illustrated in FIG. 2, conventional MLC programming uses incrementally increasing (e.g., $\Delta V$) programming pulses 201 that are applied to the access lines (e.g., word lines) of the memory cell array to achieve discrete levels of $V_t$ for the cells in the array. Between each program pulse, a verify 203 is performed to determine if the cell's target $V_t$ has been achieved. Memory cells that have reached their target $V_t$ are inhibited from further programming during subsequent pulses by biasing of the data line (e.g., bit line).

The variations in each $V_t$ distribution width 110 is an important parameter to control. The tightest possible distribution is desired, as shown in FIG. 1, in order to produce greater spacing 115 between each of the states. This enables easier discrimination between states since the possibility of a higher voltage of one distribution overlapping a lower $V_t$ of the next distribution is reduced. A smaller programming voltage step ($\Delta V$) produces a tighter distribution. However, the smaller programming voltage steps require a longer programming time. Thus, there is a trade-off between tighter distributions and programming speed.

Floating gate-to-floating gate capacitive coupling also affects distribution width. This coupling effect results from increasing density of a memory device by decreasing the distance between memory cells on the memory die. The decreased distance between cells increases the ability of each cell to affect the $V_t$ distribution of adjacent cells.

Program disturb is yet another phenomenon that can affect the $V_t$ distribution size. As mentioned earlier, memory cells that have achieved their target $V_t$ are inhibited from further programming. However, additional programming pulses having high programming voltages necessary for further programming of higher states can still increase the threshold voltages of already programmed memory cells. The increased threshold voltages result in wider threshold distributions.

For the reasons stated above, and for other reasons stated below which will become apparent to those skilled in the art upon reading and understanding the present specification, there is a need in the art for a way to reduce $V_t$ distribution width and program disturb without impacting the programming throughput of the memory device.

DETAILED DESCRIPTION

Figure 2:
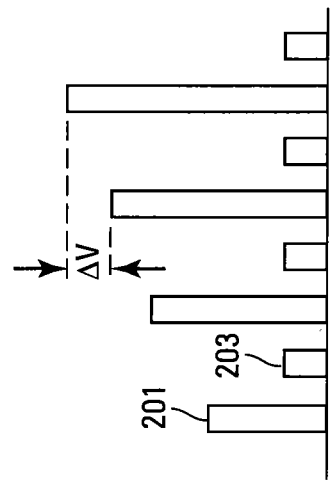
FIG. 2 shows a series of prior art program and verify pulses.
Figure 1:
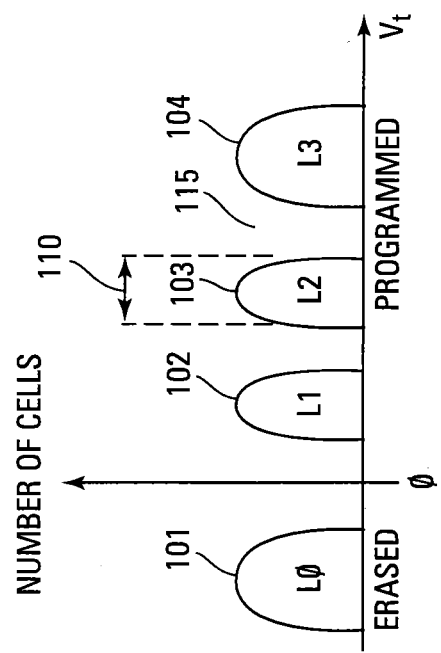
FIG. 1 shows typical prior art threshold voltage distribution diagram.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
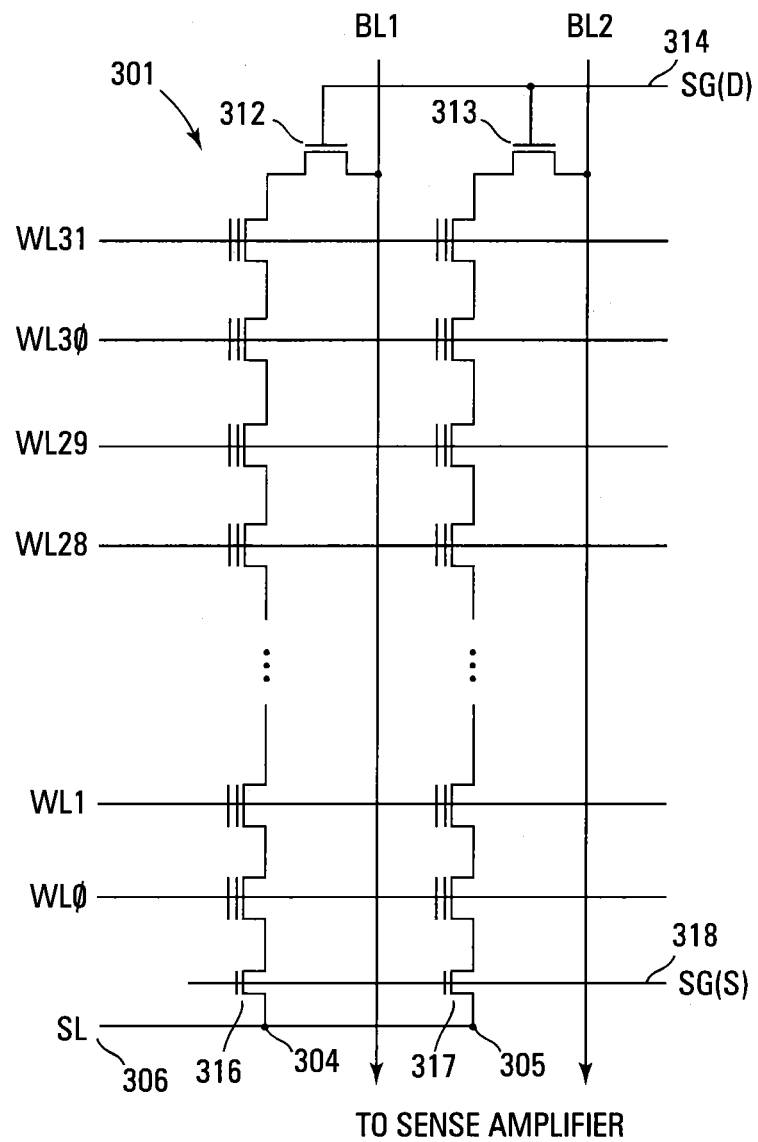
FIG. 3 shows schematic diagram of one embodiment of a nonvolatile memory array.

FIG. 3 illustrates a schematic diagram of a portion of a NAND architecture memory array comprising series strings of nonvolatile memory cells on which the embodiments of the subsequently discussed data collection and compression/decompression can operate. While the subsequent discussions refer to a NAND memory device, the present embodiments are not limited to such an architecture but can be used in other memory device architectures as well. For example, alternate embodiment arrays could be organized in NOR or AND architectures.

The memory array comprises an array of nonvolatile memory cells 301 (e.g., floating gate) arranged in columns such as series strings 304, 305. Each of the cells 301 is coupled drain to source in each series string 304, 305. A word line WL0-WL31 that spans across multiple series strings 304, 305 is connected to the control gates of each memory cell in a row in order to bias the control gates of the memory cells in the row. The bit lines BL1, BL2 are eventually connected to sense amplifiers (not shown) that detect the state of each cell by sensing current on a particular bit line.

Each series string 304, 305 of memory cells is coupled to a source line 306 by a source select gate transistor 316, 317 and to an individual bit line BL1, BL2 by a drain select gate transistor 312, 313. The source select gate transistors 316, 317 are controlled by a source select gate control line SG(S) 318 coupled to their control gates. The drain select gate transistors 312, 313 are controlled by a drain select gate control line SG(D) 314.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC has multiple $V_t$ ranges that each indicate a different state. Multilevel cells can take advantage of the analog nature of a traditional flash cell by assigning a bit pattern to a specific voltage range stored on the cell. This technology permits the storage of two or more bits per cell, depending on the quantity of voltage ranges assigned to the cell.

The memory array can be organized as memory blocks. The quantity of memory blocks is typically determined by the size of the memory device (i.e., 512 MB, 1 GB). In one embodiment, each memory block programmed in an SLC manner comprises 64 pages. In another embodiment, a memory block programmed in a MLC manner comprises 128 pages. Each page typically comprises 2048 bytes of data.

Figure 4:
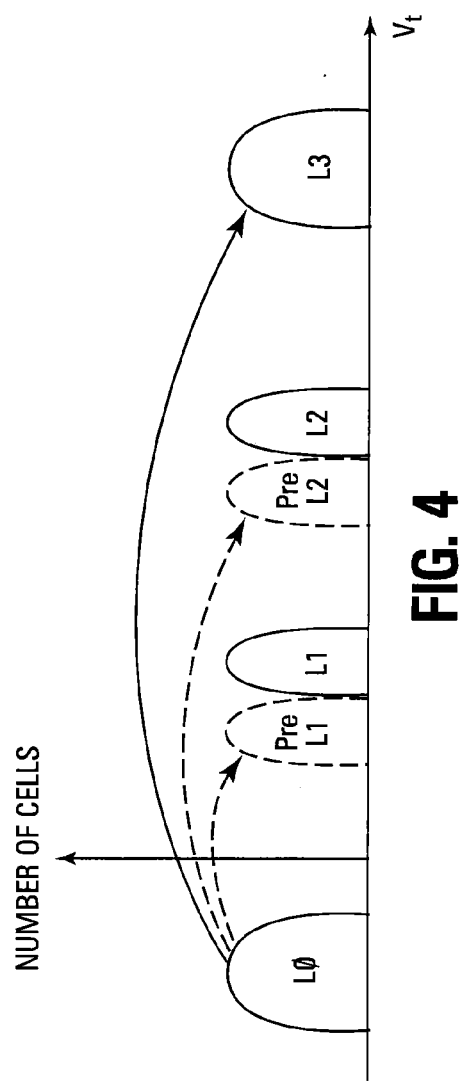
FIG. 4 shows one embodiment of a threshold distribution in accordance with a first pass programming step.

FIG. 4 illustrates a threshold voltage distribution for three possible programmed states in a memory cell. These states are labeled L1, L2, and L3. L0 is considered the erased state and typically has a negative threshold voltage. The three states shown in FIG. 4 are for illustration purposes only as alternate embodiments can have more or less than three programmed states.

The three programmed states L1-L3 are representative of digital data programmed into a memory cell. For example, L1 might represent a "01" pattern, L2 a "10" pattern, and L3 a "00" pattern. Alternate embodiments can use other digital patterns. Thus, to program a "01" to a memory cell, that particular cell's threshold voltage is moved from the erased state (e.g., "11") having a negative threshold voltage to the threshold voltage at L1. This is accomplished using the programming embodiments described subsequently.

During the programming operation, the selected word line for the memory cell to be programmed is biased with a series of incrementing voltage programming pulses. The series of pulses start at an initial voltage that is greater than a predetermined programming voltage (e.g., 16V). After each programming pulse, a verification operation is performed to determine if the cell's threshold voltage $V_t$ has increased to the target programmed level (e.g., 0.5V). In one embodiment, the verification operation uses a word line voltage of 0V on the selected word line.

During the programming operation, the unselected word lines for the remaining memory cells of the memory block being programmed are typically biased at a voltage (e.g., 10V) that is less than the programming voltage. In one embodiment, the unselected word line voltage can be any voltage above ground potential. Each of the memory cells is programmed in a substantially similar manner.

The bit line, during the programming operation, is biased at a low voltage such as ground. The higher the bit line voltage, the slower the programming of the memory cell. A voltage of $V_{CC}$ on the bit line will inhibit programming of the memory cells coupled to that particular bit line.

FIG. 4 illustrates the first pass of a programming operation. The memory cells start at the L0 level (i.e., erased state of "11"). During the first pass, the memory cells are programmed to a pre-L1 or pre-L2 level. The first pass also programs the topmost level L3 to its target $V_t$ without using a pre-L3 level. The first pass uses large $\Delta V$ increments between programming pulses. This concept is illustrated in FIG. 6.

Figure 6:
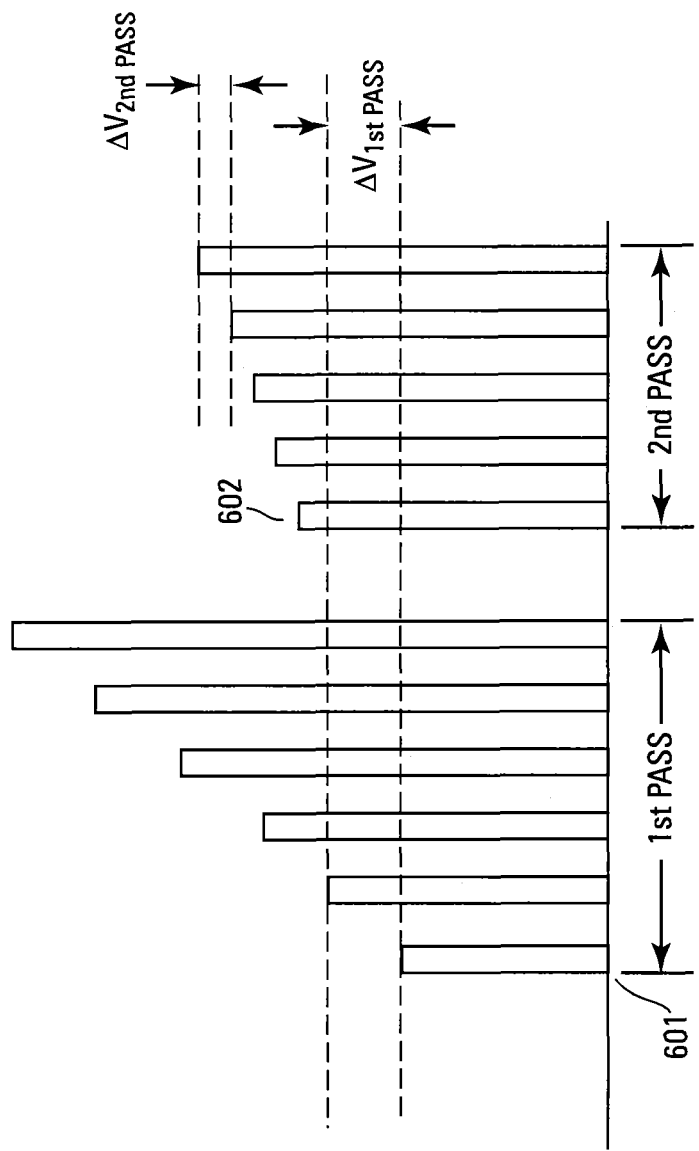
FIG. 6 shows a comparison between first pass programming pulse incremented voltages and second pass programming pulse incremented voltages.

FIG. 6 shows that during the first programming pass, the $\Delta V$ increment to the next programming pulse is greater than the $\Delta V$ used during the second programming pass. Thus, $\Delta V_{1st\,pass} > \Delta V_{2nd\,pass}$.

The topmost level L3 does not require a pre-L3 programming level since it can tolerate a wider distribution than the lower levels. This is due to the fact that the topmost level does not have any remaining levels with which it can interfere. Thus, the L3 level can use only the larger $\Delta V$ and be programmed more quickly than the remaining cells.

In one embodiment, $\Delta V_{1st\,pass}$ is optimized for programming L3. In other words, $\Delta V_{1st\,pass}$ is a voltage that programs L3 the most efficiently. This can be accomplished using empirical testing of different voltages during the manufacturing and testing process. This voltage is then used during the first pass for also programming the pre-L1 and pre-L2 levels.

In one embodiment, the starting voltage 601 of the programming operation, as illustrated in FIG. 6, is set conservatively. This reduces the chances of the memory cells being programmed to the L1 level from overshooting their target $V_t$.

Programming speed is a function of the number of program/erase cycles that a memory cell has experienced. If the memory cells are uncycled, the first few programming pulses may not cause a $V_t$ shift and are thus wasted. In the present programming method, the voltage at which the first pre-L1 cell passes the program verify operation is recorded. This voltage, or some offset of this voltage, can then be used as the starting voltage during the second programming pass.

During the first programming pass, once the pre-L1 level has been programmed, $\Delta V_{1st\,pass}$ can be altered or increased to suit the needs of programming the pre-L2 level. Similarly, once the pre-L2 level has been programmed, $\Delta V_{1st\,pass}$ can be altered or increased to suit the needs of programming the L2 level.

During the second programming pass, once the L1 level has been programmed, $\Delta V_{2nd\,pass}$ can be altered or increased to suit the needs of programming L2. Altering the program step voltage after the pre-levels or programmed levels have been reached can be done with alternate embodiments having more than four levels of threshold voltages.

Figure 5:
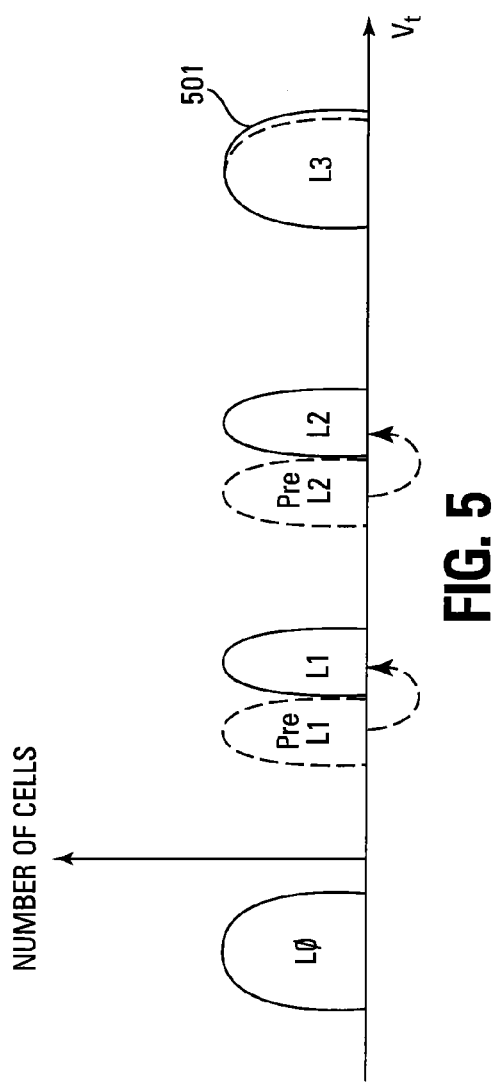
FIG. 5 shows one embodiment of a threshold distribution in accordance with a second pass programming step.

FIG. 5 illustrates the second pass of the programming operation. In the second programming pass, the starting voltage 602 as shown in FIG. 6, has been determined during the first programming pass as described previously. Also during the second programming pass, the ΔV is less in order to fine tune the movement of the pre-L1 or pre L2 levels to the target L1 or target L2 levels.

The shift in the threshold voltages from the pre-L1 and pre-L2 levels is relatively small compared to the initial programming from the erased level to the pre-levels. Thus the floating gate-to-floating gate coupling aggression will also be relatively small. Also, the program disturb induced 501 on L3 while finishing the programming of either the L1 or the L2 levels is relatively small.

Figure 7:
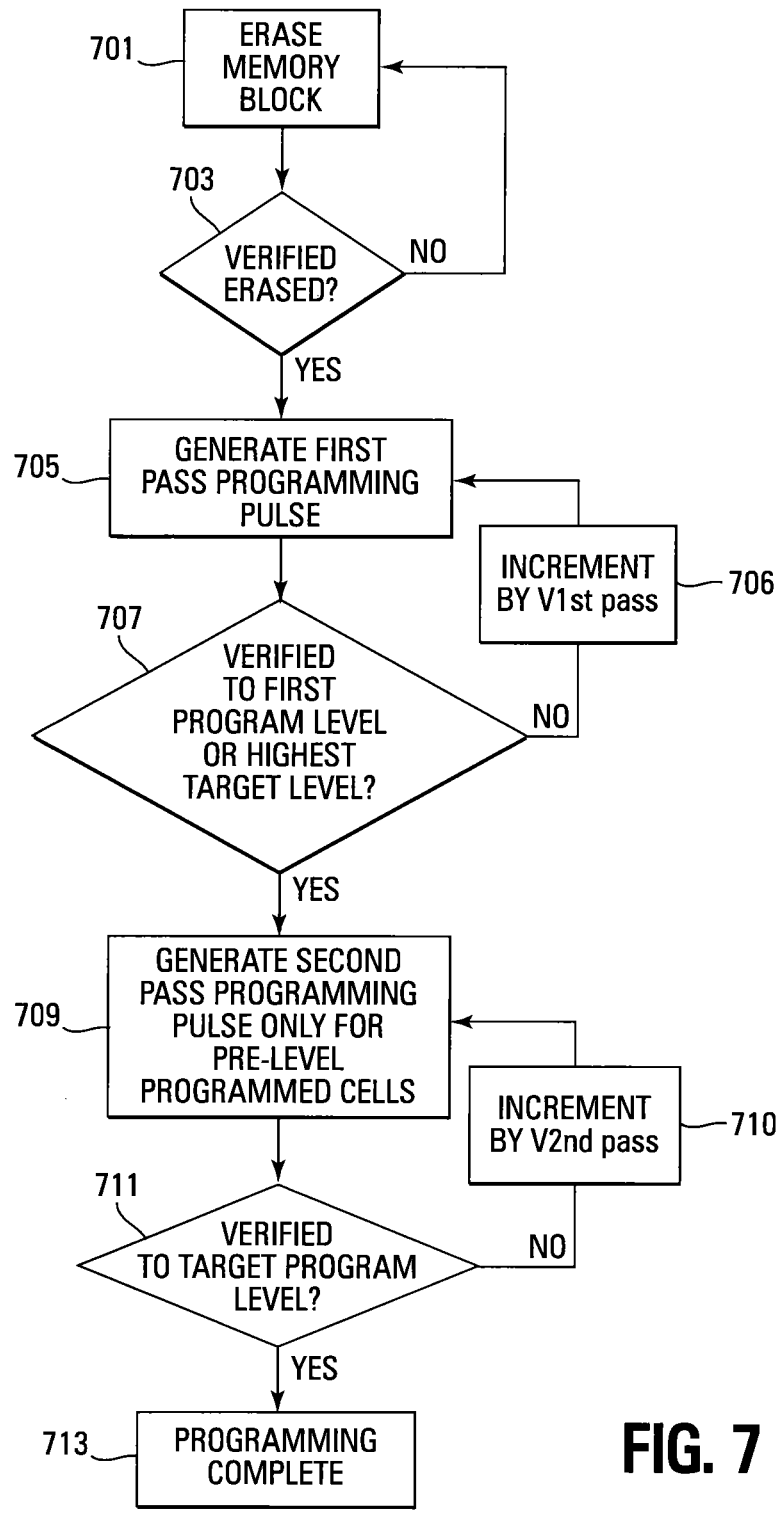
FIG. 7 shows a flowchart of one embodiment of a multi-pass programming method.

Reference is made to the programming pulses of FIG. 6 while describing the programming method illustrated in the flowchart of FIG. 7. The method begins with an erase operation performed on the memory cell block comprising the target memory cells to be programmed 701. In one embodiment, the erase operation comprises biasing the word lines to be erased with a large negative voltage pulse. An erase verify operation 703 is then performed. If the memory cell block is not erased, the erase pulses continue until the erase verify operation passes.

The first programming pass begins at the conservative programming voltage 601 and increases by $\Delta V_{1st\,pass}$ for every subsequent programming pulse. Thus, the first pass programming pulse is generated 705 at the start voltage 601. A program verify operation is then performed 707 to determine if the memory cell is programmed to the pre-level (e.g., pre-L1 or pre-L2) or the highest target level. If the program verify 707 fails, the memory cell has not yet reached the threshold voltage for either pre-level or the highest target level. The programming voltage is then increased by $\Delta V_{1st\,pass}$ 706. This first pass programming operation 705, 706, 707 is performed until the memory cell reaches its pre-level threshold voltage or the highest target level.

If the program verify 707 passes, the second pass programming pulses are generated. The voltage for the first programming pulse 602 for the second pass is determined from the first programming pass as described previously. This programming pulse is then generated 709 only for the memory cells programmed to their pre-level since the target memory cell programmed to the highest target level is done programming. A program verify operation is performed to determine if the memory cell has reached its target program level 711. If the memory cell has not reached the threshold voltage for this level, the programming pulse is increased by $\Delta V_{2nd\,pass}$ 710 and the second pass programming operation 709, 710, 711 is repeated until the memory cell being programmed reaches the target level. At this point, the programming operation has been completed 713.

Figure 8:
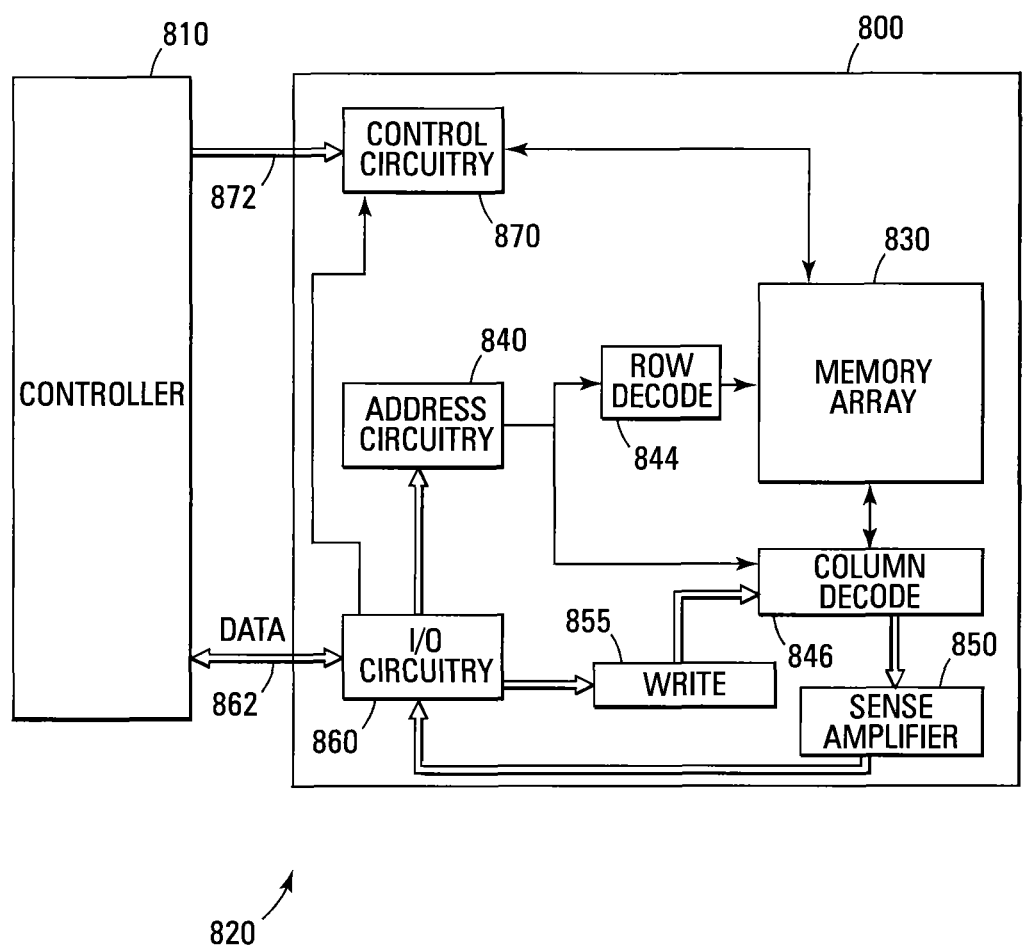
FIG. 8 shows a simplified block diagram of one embodiment of a memory system of the present invention.

FIG. 8 illustrates a functional block diagram of a memory system 820 that includes a memory device 800. The memory device 800 has been simplified to focus on features of the memory that are helpful in understanding the present embodiments for memory programming. The memory device 800 is coupled to an external system controller 810. The controller 810 may be a microprocessor or some other type of control circuitry.

The memory device 800 includes an array 830 of non-volatile memory cells, such as the one illustrated in FIG. 3 and discussed previously. The memory array 830 is arranged in banks of word line rows and bit line columns. In one embodiment, the columns of the memory array 830 comprise series strings of memory cells. As is well known in the art, the connections of the cells to the bit lines determines whether the array is a NAND architecture, an AND architecture, or a NOR architecture.

Address buffer circuitry 840 is provided to latch address signals provided through the I/O circuitry 860. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense amplifier circuitry 850. The sense amplifier circuitry 850, in one embodiment, is coupled to read and latch a row of data from the memory array 830. I/O circuitry 860 is included for bidirectional data communication as well as address communication over a plurality of data connections 862 with the controller 810. Write circuitry 855 is provided to program data to the memory array 830.

Memory control circuitry 870 decodes signals provided on control connections 872 from the controller 810. These signals are used to control the operations on the memory array 830, including data read, data write (program), and erase operations. The memory control circuitry 870 may be a state machine, a sequencer, or some other type of controller to generate the memory control signals. In one embodiment, the memory control circuitry 870 is configured to transfer data to the memory array 830 for execution of the programming embodiments discussed previously. The memory control circuitry 870 is further configured to read data from the memory array 830.

The memory device illustrated in FIG. 8 has been simplified to facilitate a basic understanding of the features of the memory. A more detailed understanding of internal circuitry and functions of flash memories are known to those skilled in the art.

CONCLUSION

In summary, one or more embodiments of the present invention provide a method for programming multilevel cell solid state memory devices in order to produce narrow $V_t$ distributions and mitigate floating gate-to-floating gate coupling without impacting programming speed. This can be accomplished by programming, during a first programming pass, memory cells having lower target levels to a pre-level and memory cells having an upper level to its target level. A second programming pass programs the lower levels to their associated target levels. The first programming pass programs the memory cell at a faster program rate than the second programming pass due to the greater ΔV between the programming pulses in the first programming pass.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a plurality of memory cells, wherein a first subset of the plurality of memory cells are to be programmed to a first programmed state of a plurality of programmed states and a second subset of the plurality of memory cells are to be programmed to a second programmed state of the plurality of programmed states, the method comprising:

applying a first plurality of incrementing voltage pulses to the plurality of memory cells; and responsive to the second subset of the plurality of memory cells being programmed to the second programmed state, applying a second plurality of incrementing voltage pulses to the plurality of memory cells, wherein a difference between voltage levels of adjacent pulses of the first plurality of incrementing voltage pulses is greater than a difference between voltage levels of adjacent pulses of the second plurality of incrementing voltage pulses.

2. The method of claim 1, wherein applying the first plurality of incrementing voltage pulses programs the first subset of the plurality of memory cells to a program pre-level associated with the first programmed state.

3. The method of claim 2, wherein a third subset of the plurality of memory cells are to be programmed to a third programmed state of the plurality of programmed states, and wherein applying the first plurality of incrementing voltage pulses programs the third subset of the plurality of memory cells to a program pre-level associated with the third programmed state.

4. The method of claim 3, wherein the second programmed state is associated with a threshold voltage level that is higher than a threshold voltage level associated with the third programmed state, and wherein the threshold voltage level associated with the third programmed state is higher than a threshold voltage associated with the first programmed state.

5. The method of claim 3, wherein the second programmed state comprises a L3 state, the first programmed state comprises a L1 state, and the third programmed state comprises a L2 state.

6. The method of claim 2, and further comprising:
determining a voltage at which a first cell of the first subset of the plurality of memory cells passes a program verify operation as verified to the program pre-level associated with the first programmed state; and
applying the second plurality of incrementing voltage pulses starting at the determined voltage.

7. The method of claim 2, and further comprising:
determining a voltage at which a first cell of the first subset of the plurality of memory cells passes a program verify operation as verified to the program pre-level associated with the first programmed state; and
applying the second plurality of incrementing voltage pulses starting at an offset from the determined voltage.

8. The method of claim 1, wherein applying the second plurality of incrementing voltage pulses comprises applying a first pulse of the second plurality of incrementing voltage pulses at a voltage greater than a first voltage pulse of the first plurality of incrementing voltage pulses.

9. The method of claim 1, wherein applying the second plurality of incrementing voltage pulses programs the first subset of the plurality of memory cells to a target program level associated with the first programmed state.

10. The method of claim 9, wherein a third subset of the plurality of memory cells are to be programmed to a third programmed state of the plurality of programmed states, and wherein applying the first plurality of incrementing voltage pulses programs the third subset of the plurality of memory cells to a program pre-level associated with the third programmed state, and wherein applying the second plurality of incrementing voltage pulses programs the third subset of the plurality of memory cells to a target program level associated with the third programmed state.

11. The method of claim 1, wherein the difference between voltage levels of adjacent pulses of the second plurality of incrementing voltage pulses is adjusted to improve programming efficiency for programming to the third programmed state.

12. A method for programming a plurality of memory cells, the method comprising:

applying a first plurality of incrementing voltage pulses to the plurality of memory cells, wherein applying the first plurality of incrementing voltage pulses programs a first subset of the plurality of memory cells to a program pre-level associated with a first programmed state and programs a second subset of the plurality of memory cells to a second programmed state; and applying a second plurality of incrementing voltage pulses to the plurality of memory cells, wherein applying the second plurality of incrementing voltage pulses programs the first subset of the plurality of memory cells from the program pre-level to the first programmed state and wherein a difference between voltage levels of adjacent pulses of the first plurality of incrementing voltage pulses is greater than a difference between voltage levels of adjacent pulses of the second plurality of incrementing voltage pulses.

13. The method of claim 12, wherein the second plurality of incrementing voltage pulses is applied starting at a voltage higher than a starting voltage of the first plurality of incrementing voltage pulses.

14. The method of claim 13, and further comprising:
determining a voltage at which a first cell of the first subset of the plurality of memory cells passes a program verify operation as verified to the program pre-level associated with the first programmed state; and
applying the second plurality of incrementing voltage pulses starting at the determined voltage.

15. The method of claim 13, and further comprising:
determining a voltage at which a first cell of the first subset of the plurality of memory cells passes a program verify operation as verified to the program pre-level associated with the first programmed state; and
applying the second plurality of incrementing voltage pulses starting at an offset from the determined voltage.

16. The method of claim 12, wherein applying the first plurality of incrementing voltage pulses programs a third subset of the plurality of memory cells to a program pre-level associated with a third programmed state of the plurality of programmed states, and wherein applying the second plurality of incrementing voltage pulses programs the third subset of the plurality of memory cells to a target program level associated with the third programmed state.

17. The method of claim 16, wherein the second programmed state is associated with a threshold voltage level that is higher than a threshold voltage level associated with the third programmed state, and wherein the threshold voltage level associated with the third programmed state is higher than a threshold voltage associated with the first programmed state.

18. The method of claim 12, wherein applying the second plurality of incrementing voltage pulses programs the first subset of the plurality of memory cells to a program level associated with the first programmed state.

19. The method of claim 12, wherein the difference between voltage levels of adjacent pulses of the second plurality of incrementing voltage pulses is adjusted to improve programming efficiency for programming to the third programmed state.

20. A memory device, comprising:
a memory array comprising a plurality of memory cells; and
control circuitry coupled to the memory array, the control circuitry configured to program a plurality of memory cells, wherein a first subset of the plurality of memory cells are to be programmed a first subset of the plurality of memory cells to a first programmed state of a plurality of programmed states, and a second subset of the plurality of memory cells are to be programmed to a second programmed state of the plurality of programmed states, the method comprising:
applying a first plurality of incrementing voltage pulses to the plurality of memory cells; and
responsive to the second subset of the plurality of memory cells being programmed to the second programmed state, applying a second plurality of incrementing voltage pulses to the plurality of memory cells, wherein a difference between voltage levels of adjacent pulses of the first plurality of incrementing voltage pulses is greater than a difference between voltage levels of adjacent pulses of the second plurality of incrementing voltage pulses.

21. A memory device, comprising:
a memory array comprising a plurality of memory cells; and
control circuitry coupled to the memory array, the control circuitry configured to apply a first plurality of incrementing voltage pulses to the plurality of memory cells, wherein applying the first plurality of incrementing voltage pulses programs a first subset of the plurality of memory cells to a program pre-level associated with a first programmed state and programs a second subset of the plurality of memory cells to a second programmed state; and to apply a second plurality of incrementing voltage pulses to the plurality of memory cells, wherein applying the second plurality of incrementing voltage pulses programs the first subset of the plurality of memory cells from the program pre-level to the first programmed state and wherein a difference between voltage levels of adjacent pulses of the first plurality of incrementing voltage pulses is greater than a difference between voltage levels of adjacent pulses of the second plurality of incrementing voltage pulses.

* * * * *